US012782411B2

(12) United States Patent
Lange

(10) Patent No.: US 12,782,411 B2
(45) Date of Patent: Nov. 3, 2026

(54) ARRANGEMENT HAVING AN INSULATION MONITOR, AND IT SYSTEM

(71) Applicant: Siemens Aktiengesellschaft, Munich (DE)

(72) Inventor: Robert Lange, Crimmitschau (DE)

(73) Assignee: Siemens Aktiengesellschaft, Munich (DE)

( * ) Notice: Subject to any disclaimer, the term of this patent is extended or adjusted under 35 U.S.C. 154(b) by 255 days.

(21) Appl. No.: 18/641,351

(22) Filed: Apr. 20, 2024

(65) Prior Publication Data

US 2024/0353465 A1 Oct. 24, 2024

(30) Foreign Application Priority Data

Apr. 20, 2023 (EP) .................................... 23169015

(51) Int. Cl.

*G01R 31/12* (2020.01)
*G01R 27/20* (2006.01)
*G01R 31/52* (2020.01)

(52) U.S. Cl.

CPC ....... *G01R 31/1245* (2013.01); *G01R 27/205* (2013.01); *G01R 31/52* (2020.01)

(58) Field of Classification Search

CPC .. G01R 31/1245; G01R 31/52; G01R 31/203; G01R 31/12; G01R 27/18; G01R 27/205; G01R 1/203; H02H 3/16; H02M 5/458; H02M 9/08
USPC .......................................................... 324/551
See application file for complete search history.

(56) References Cited

U.S. PATENT DOCUMENTS

| | | | | |
|---|---|---|---|---|
| 3,383,555 | A * | 5/1968 | Minks | F02P 3/0884 315/223 |
| 3,975,663 | A | 8/1976 | Moorey | |
| 4,375,660 | A | 3/1983 | Tate | |
| 11,275,102 | B2 | 3/2022 | Broeckmann | |
| 11,391,785 | B2 | 7/2022 | Hackl | |
| 11,719,759 | B2 | 8/2023 | Reitz | |
| 2006/0006815 | A1 * | 1/2006 | Alexandrov | H05B 41/2828 315/291 |
| 2016/0336732 | A1 | 11/2016 | Hackl | |

(Continued)

FOREIGN PATENT DOCUMENTS

| | | | |
|---|---|---|---|
| CN | 209198598 | U | 8/2019 |
| CN | 209673895 | U | 11/2019 |
| DE | 722348 | C | 7/1942 |

(Continued)

OTHER PUBLICATIONS

Kim; Translation of KR 20180104795 A; Pub Sep. 27, 2018; Translated by Clarivate (Year: 2018).*

(Continued)

*Primary Examiner* — Alesa Allgood
*Assistant Examiner* — Rahul Maini
(74) *Attorney, Agent, or Firm* — Lempia Summerfield Katz LLC

(57) ABSTRACT

An arrangement having an insulation monitor for an IT system and a discharge resistor for discharging a ground discharge capacitance of the IT system is provided. The arrangement has two Z diodes that are arranged back-to-back and connected in series with the discharge resistor. Each of the two Z diodes has a reverse voltage above a test voltage of the insulation monitor.

8 Claims, 3 Drawing Sheets

(56) References Cited

U.S. PATENT DOCUMENTS

2020/0110125 A1 4/2020 Lehnhardt

FOREIGN PATENT DOCUMENTS

| | | | | |
|---|---|---|---|---|
| DE | 102011055371 B4 | | 10/2016 | |
| EP | 1845548 B1 | | 3/2013 | |
| EP | 3620800 A1 | | 3/2020 | |
| EP | 3862763 A1 | | 8/2021 | |
| EP | 4089423 A1 | | 11/2022 | |
| FR | 2976084 A1 | | 12/2012 | |
| KR | 20180104795 A | * | 9/2018 | ............ G01R 31/50 |

OTHER PUBLICATIONS

Bender, "Isometer ISO 685 (W)-D-PInsulation monitoring devicewith integrated test current generatorfor IT AC voltage systems" with English abstract. https://www.bender.de/fileadmin/content/Products/m/d/iso685-x-P_D00170_M_XXDE.pdf; pp. 1-89.

* cited by examiner

ARRANGEMENT HAVING AN INSULATION MONITOR, AND IT SYSTEM

This application claims the benefit of European Patent Application No. EP 23169015.7, filed on Apr. 20, 2023, which is hereby incorporated by reference in its entirety.

BACKGROUND

The present embodiments relate to an arrangement having an insulation monitor for an IT system and a discharge resistor for discharging a ground discharge capacitance of the IT system.

Electrical networks without a galvanic connection between active conductors and grounded parts are referred to as IT networks or IT systems (French: "Isolé Terre" [isolated ground]) or also as an isolated network. In IT networks, insulation monitors are used to increase installation availability. For this purpose, a maximum effective capacitance or (ground) discharge capacitance and a discharge resistance may be set in insulation monitors.

IT systems are used in mostly small-scale industrial networks and in hospitals. In these networks, the neutral point is not grounded. Therefore, a simple ground fault does not immediately lead to a network failure and may be rectified during operation if necessary. The insulation monitoring device then indicates the fault caused by a reactive current at the location of the fault. The magnitude of the reactive current depends on the ground discharge capacitance of the IT network. During operation of converters and power supplies in the IT network, the capacitances and discharge currents acting with respect to ground (PE) may be low.

DE722348C discloses, for example, an insulation monitoring and ground fault indicator device for AC systems, in which at least one of the phases and a neutral point are connected in a common point and grounded via resistors of any phase, but of approximately the same order of magnitude as the absolute values of the normal complex discharge resistance of the installation to be monitored with respect to ground. The current flowing in the common ground line is used to detect ground faults or, if the network is sound, as an approximate measure of the complex discharge resistance of the installation with respect to ground.

A more contemporary variant exists, for example, with the Bender Isometer 685 insulation monitoring device (https://www.bender.de/fileadmin/content/Products/m/d/iso685-x-P_D00170_M_XXDE.pdf). By way of example, the device is capable of monitoring capacitances up to 1000 μF and insulation resistances >10 kΩ.

It is common for devices that are intended for both the TN network (e.g., grounding at the power source and the electrical operating means (TN-C system, TN-C-S system, TN-S system)) and the IT network to disconnect a portion of the filter capacitors acting as protective earth (PE) during operation in the IT network. This reduces the capacitance acting as protective earth PE, but still allows basic interference suppression of the device. High-impedance resistors are connected in parallel via the capacitances acting as protective earth PE. High-impedance resistors are used for the defined discharge of the specified capacitances. In order to avoid dangerous voltages for maintenance personnel, a defined discharge (e.g., less than 60 V) is to be provided. In 24 V networks, there are also capacitances and discharge resistors as PE. In this case, these may be used for the defined discharge of the capacitances after a surge pulse.

SUMMARY AND DESCRIPTION

The scope of the present invention is defined solely by the appended claims and is not affected to any degree by the statements within this summary.

It is a challenge, for example, from the point of view of an installation operator, to achieve as large resistance values as possible and as small capacitances as possible. Further, it is often desirable to monitor as many power supplies and devices as possible using an insulation monitor so that comparatively fewer insulation monitors are sufficient for monitoring the insulation of the entire installation.

The present embodiments may obviate one or more of the drawbacks or limitations in the related art. For example, arrangements with an insulation monitor configured such that further optimization is achieved with regard to the aforementioned challenge are provided.

Specifically, the arrangement includes two Z diodes that are arranged back-to-back and connected in series with a discharge resistor. The two Z diodes each have a reverse voltage above a test voltage of the insulation monitor. According to the present embodiments, the discharge resistor is replaced by a series circuit that is composed of Z diodes that are connected back-to-back, and the discharge resistor. The defined discharging of the capacitors to a voltage below 60 V or after surge pulses may still be provided. The discharge resistance is to be adjusted where necessary. The fundamental consideration that the resistance for the insulation monitor is hidden as a result of the connection of Z diodes of the present embodiments, which are arranged back-to-back, in series with the discharge resistor is provided. During a test cycle, the insulation monitor generates a test voltage having a polarity that is periodically reversed. This test voltage may be approximately 10 V. In terms of the reverse voltage, the Z diodes are selected to be above this voltage value so that the desired effect of hiding the discharge resistor is provided, for example.

Specifically, the arrangement may have two Z diodes that are arranged back-to-back and connected in series with the discharge resistor. The two Z diodes each have a reverse voltage above a test voltage of the insulation monitor.

One development of the present embodiments makes provision for an interference suppression capacitor to be arranged in parallel with the series circuit that is composed of the discharge resistor and the two Z diodes that are arranged back-to-back.

Such interference suppression capacitors are used for the basic interference suppression of an IT system in order to divert higher-frequency interference components from the system. This diverting is well suited for the parallel arrangement of the series circuit of the present embodiments consisting of the discharge resistor and the two Z diodes that are arranged back-to-back, such that the entire ground discharge capacitance may be discharged by the series circuit up to the reverse voltage of the Z diodes.

One development of the present embodiments makes provision for an additional discharge resistor to be arranged in parallel with the two Z diodes that are arranged back-to-back, and in series with the discharge resistor. The additional discharge resistor has a higher resistance value than the discharge resistor that is arranged in series with the two Z diodes that are arranged back-to-back.

The advantage gained by the present embodiments in this development is that the insulation monitor ISG does not "see" the lower-impedance discharge resistor in the series arrangement to the pair of Z diodes that are arranged back-to-back, but sees only the comparatively higher-impedance additional discharge resistor. In this way, a virtually gradual discharge occurs such that voltages above the reverse voltage of the Z diodes are discharged more quickly and voltages below the reverse voltage are discharged more slowly.

DETAILED DESCRIPTION

Functionally same components are sometimes provided with same reference signs. Functionally same components are sometimes not identified in all figures and are also not explained separately again for each individual figure. It may be assumed, in principle, that these components in the different illustrations each have a substantially same function.

Figure 1:
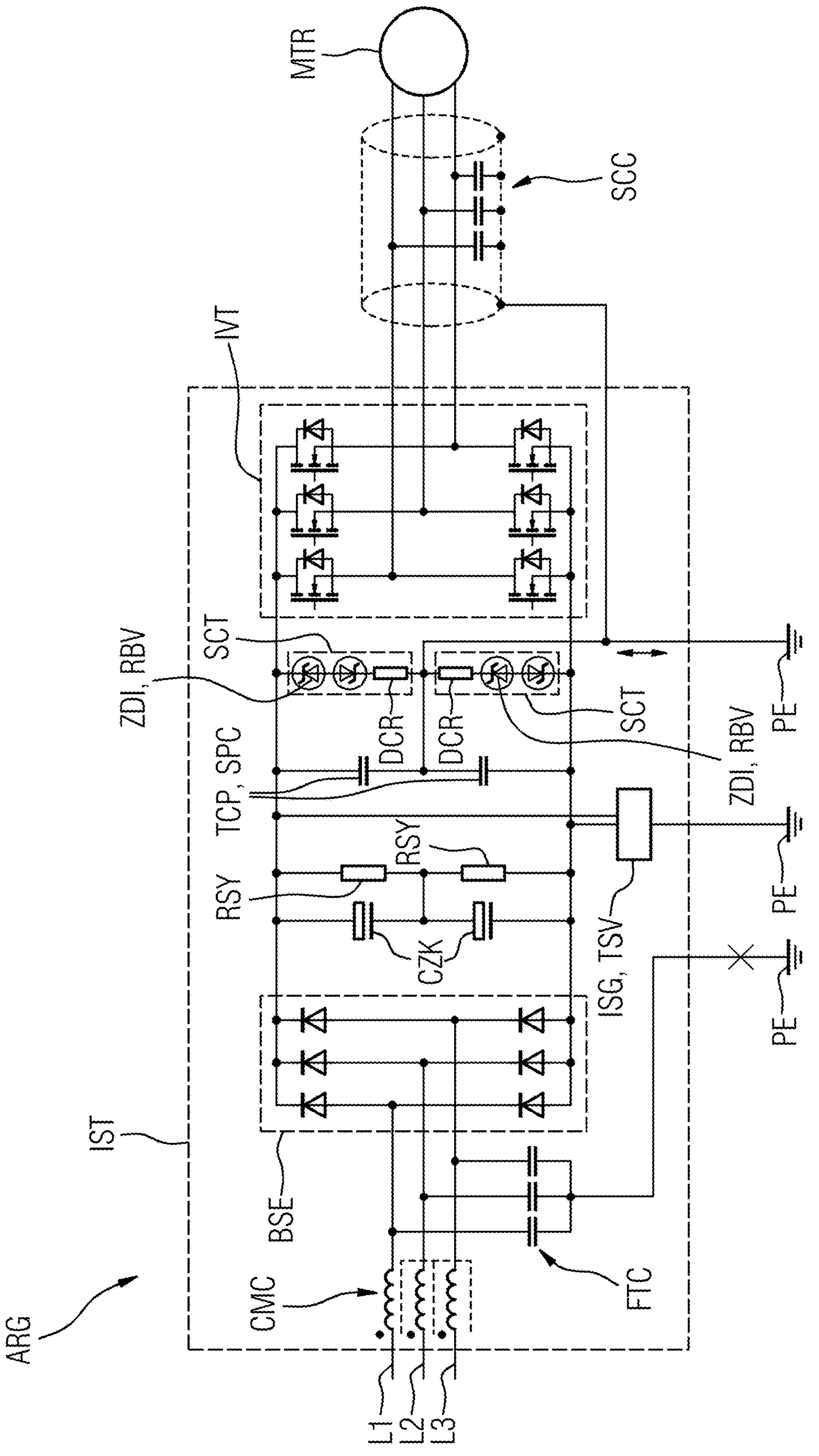
FIGS. 1, 2, and 3 each show a schematic circuit diagram of an embodiment.
Figure 2:
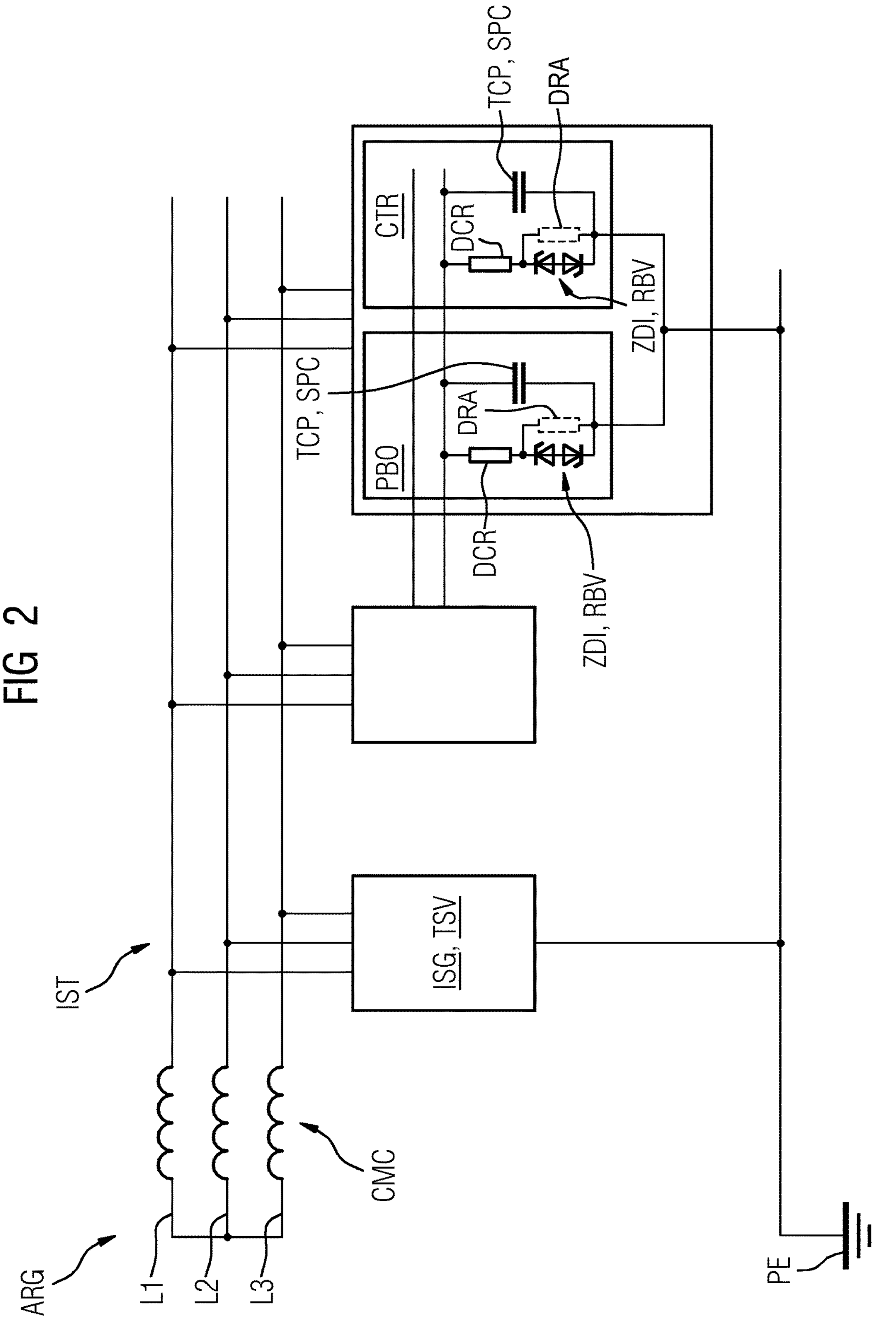
Figure 3:
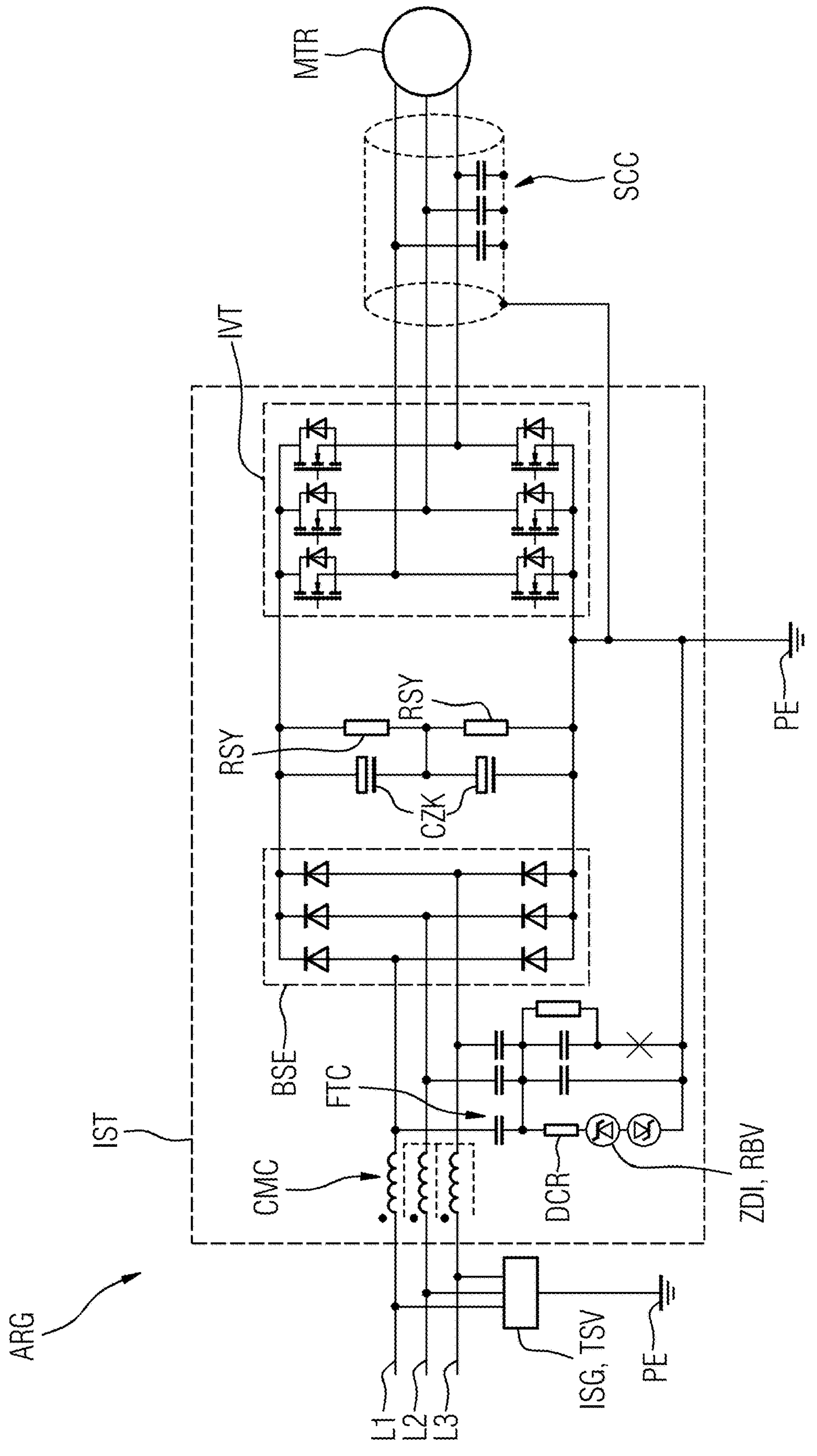

The embodiments shown schematically as a circuit diagram in each of FIGS. 1, 2 and 3 relate in each case to an arrangement ARG having an insulation monitor ISG for an IT system IST and a discharge resistor DCR for discharging a ground discharge capacitance TCP of the IT system IST.

The IT system IST is supplied with power using alternating current (AC phases L1, L2, L3). A common-mode choke CMC is used to limit the current in the IT system IST. The individual AC phases are each connected to a filter capacitor FTC in order to divert undesired frequencies to ground. This connection is interrupted when the arrangement ARG is operated in accordance with the present embodiments in the IT network. The alternating current is subsequently rectified by a B6 rectifier BSE. DC link capacitors CZK enable the removal of unwanted frequencies after rectification.

A load that is connected, for example, as a motor MTR with a shielded motor cable SCC to a circuit breaker IVT is connected at the output of the arrangement ARG.

The circuit diagram shows ground discharge capacitances TCP. These ground discharge capacitances TCP illustrate in this case the capacitance of the IT system IST with respect to ground PE and may also include interference suppression capacitors SPC. For the safe discharge of the ground discharge capacitances TCP, a discharge resistor DCR is provided on each of the DC lines (e.g., in parallel with the ground discharge capacitance TCP). In order that the insulation monitor ISG does not concomitantly measure these discharge resistors DCR during a test run with a test voltage TSV with alternating polarity, it is provided according to the present embodiments that in each case two Z diodes ZDI that are arranged back-to-back are connected in series SCT with the discharge resistor DCR, where the Z diodes ZDI each have a reverse voltage RBV above a test voltage TSV of the insulation monitor ISG.

The arrangement ARG, which is illustrated in simplified form in FIG. 2, is basically similar and provides a converter-controlled servo motor (e.g., a SINAMICS S210 servo drive system from Siemens). The converter CVT shown includes a power unit PBO and a control unit CTR. These components of the converter CVT are supplied with a rectified voltage by a 24 V power supply. An insulation monitor ISG is connected in the IT system IST shown in order to monitor ground faults between the ground PE and the AC phases L1, L2, L3.

For each component of the converter CVT, a respective ground discharge capacitance TCP is provided with a parallel-connected discharge resistor DCR. According to the present embodiments, in each case, two Z diodes ZDI that are arranged back-to-back are connected in series SCT with the discharge resistor DCR. The Z diodes ZDI each have a reverse voltage RBV above a test voltage TSV of the insulation monitor ISG. To avoid undetermined potentials between the series circuit SCT of the pair of Z diodes and the discharge resistor DCR, an additional discharge resistor DRA is arranged in series with the discharge resistor DCR. The additional discharge resistor DRA has a higher resistance value than the discharge resistor DCR arranged in series with the two Z diodes ZDI that are arranged back-to-back. The insulation monitor as a result only sees the higher resistance value of the additional discharge resistor DRA in each case. As a result of this, a rapid discharge is provided by the lower-resistance discharge resistor DCR.

The respective discharge resistor may be adjusted as required. According to the present embodiments, the resistance is "blanked out" for the insulation monitor ISG, or the resistance measured by the insulation monitor ISG is significantly increased compared to the actual discharge resistance. The adjustable measurement voltages of the insulation monitor ISG are typically between 10 V-60 V depending on the mode. This test voltage TSV is applied during the measurement with alternating polarity. The following table shows the measurement results with different combinations in DC power mode (e.g., measurement voltage of the Bender Isometer 685=50 V, configuration according to FIG. 1):

| Discharge resistance used [kΩ] | Z diodes used | Measured resistance of Isometer 685 [kΩ] |
|---|---|---|
| any | any | >10000 |
| 18 | none | 18 |
| 18 | 30 V Z diode | 335 |
| 330 | none | 330 |
| 330 | 24 V Z diode | 780 |
| none | 15 V Z diode | 81 |

The measurement results show that the resistance measured using the insulation monitor increases significantly through the use of the Z diodes.

FIG. 3 schematically shows a circuit diagram of the arrangement ARG having an insulation monitor ISG for an IT system IST and a discharge resistor DCR for discharging a ground discharge capacitance TCP of the IT system IST in a basic configuration. The arrangement ARG and the function thereof correspond to that of FIG. 1 with the difference that the insulation monitor ISG is connected upstream of the common-mode choke CMC of the IT system IST. In this way, a larger area of the circuit shown is operated as an IT system and monitored using the insulation monitor ISG. The crossed-out line in the area of the three filter capacitors FTC symbolizes a line disconnection when the arrangement ARG is operated as an IT system IST.

Irrespective of the grammatical gender of a specific term, persons with male, female, or other gender identity are also included in this document.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An arrangement comprising:

an insulation monitor for an Isolated Terra (IT) system;

a discharge resistor configured for discharging a ground discharge capacitance of the IT system; and two Z diodes that are arranged back-to-back and connected in series with the discharge resistor, wherein each of the two Z diodes has a reverse voltage above a test voltage applied by the insulation monitor to the IT system.

2. The arrangement of claim 1, further comprising an interference suppression capacitor arranged in parallel with a series circuit that includes the discharge resistor and the two Z diodes that are arranged back-to-back.

3. The arrangement of claim 1, wherein the discharge resistor is a first discharge resistor, wherein the arrangement further comprises a second discharge resistor that is arranged in parallel with the two Z diodes that are arranged back-to-back, and in series with the first discharge resistor, and wherein the second discharge resistor has a higher resistance value than the first discharge resistor, which is arranged in series with the two Z diodes that are arranged back-to-back.

4. The arrangement of claim 2, wherein the discharge resistor is a first discharge resistor, wherein the arrangement further comprises a second discharge resistor that is arranged in parallel with the two Z diodes that are arranged back-to-back, and in series with the first discharge resistor, and wherein the second discharge resistor has a higher resistance value than the first discharge resistor, which is arranged in series with the two Z diodes that are arranged back-to-back.

5. An Isolated Terra (IT) system comprising:

an arrangement comprising:

an insulation monitor for an IT system;

a discharge resistor configured for discharging a ground discharge capacitance of the IT system; and two Z diodes that are arranged back-to-back and connected in series with the discharge resistor, wherein each of the two Z diodes has a reverse voltage above a test voltage applied by the insulation monitor to the IT system.

6. The IT system of claim 5, wherein the arrangement further comprises an interference suppression capacitor arranged in parallel with a series circuit that includes the discharge resistor and the two Z diodes that are arranged back-to-back.

7. The IT system of claim 5, wherein the discharge resistor is a first discharge resistor, wherein the arrangement further comprises a second discharge resistor that is arranged in parallel with the two Z diodes that are arranged back-to-back, and in series with the first discharge resistor, and wherein the second discharge resistor has a higher resistance value than the first discharge resistor, which is arranged in series with the two Z diodes that are arranged back-to-back.

8. The IT system of claim 6, wherein the discharge resistor is a first discharge resistor, wherein the arrangement further comprises a second discharge resistor that is arranged in parallel with the two Z diodes that are arranged back-to-back, and in series with the first discharge resistor, and wherein the second discharge resistor has a higher resistance value than the first discharge resistor, which is arranged in series with the two Z diodes that are arranged back-to-back.

* * * * *